United States Patent
Asano et al.

(10) Patent No.: US 8,680,428 B2
(45) Date of Patent: Mar. 25, 2014

(54) SLIT WIDTH ADJUSTING DEVICE AND MICROSCOPE LASER PROCESSING APPARATUS

(75) Inventors: Hidemitsu Asano, Kawasaki (JP); Makoto Uwada, Kawasaki (JP); Makoto Kaieda, Miyazaki (JP)

(73) Assignee: Mitutoyo Corporation, Kawasaki (JP)

( * ) Notice: Subject to any disclaimer, the term of this patent is extended or adjusted under 35 U.S.C. 154(b) by 1046 days.

(21) Appl. No.: 12/453,920

(22) Filed: May 27, 2009

(65) Prior Publication Data

US 2009/0314749 A1     Dec. 24, 2009

(30) Foreign Application Priority Data

Jun. 19, 2008   (JP) ................................ 2008-160054

(51) Int. Cl.
    *B23K 26/00*       (2006.01)
    *G01J 1/20*        (2006.01)

(52) U.S. Cl.
    USPC .................................... 219/121.6; 250/201.1

(58) Field of Classification Search
    USPC ........ 219/121.83, 121.73; 359/230, 232, 738; 353/97; 250/281, 288; 318/571, 572
    See application file for complete search history.

(56) References Cited

U.S. PATENT DOCUMENTS

| | | | | |
|---|---|---|---|---|
| 5,508,838 A | * | 4/1996 | Shimizu et al. | 359/232 |
| 6,130,403 A | * | 10/2000 | Wakabayashi | 219/121.68 |
| 7,170,595 B2 | * | 1/2007 | Smith et al. | 356/300 |
| 2006/0144828 A1 | * | 7/2006 | Fukumitsu et al. | 219/121.67 |

FOREIGN PATENT DOCUMENTS

| | | | |
|---|---|---|---|
| JP | 10090008 A | * | 4/1998 |
| JP | A-2001-208987 | | 8/2001 |
| JP | A-2005-292532 | | 10/2005 |
| JP | A-2007-047657 | | 2/2007 |
| KR | 2001-0043177 A | | 5/2001 |

OTHER PUBLICATIONS

Machine Translation of JP 1009008, Apr. 2012.*

* cited by examiner

*Primary Examiner* — Henry Yuen
*Assistant Examiner* — Thomas Ward
(74) *Attorney, Agent, or Firm* — Oliff PLC

(57) ABSTRACT

Disclosed is a slit width adjusting device comprising: a pair of slit members parallel to each other, which is moved to approach each other or to be separated from each other to adjust a slit width; a driving section to move the pair of slit members; an absolute position original point detection section to detect an arbitrary absolute position of the slit members as an original point; and an adjustment section to adjust the slit width, wherein the adjustment section comprises: a storage unit to store a slit width table in which a displacement amount of the slit width from the original point, and a drive instruction value corresponding to the displacement amount, are corresponding to each other; and a drive control unit to extract the drive instruction value corresponding to a specified slit width, to drive the driving section according to the extracted drive instruction value.

5 Claims, 7 Drawing Sheets

SLIT WIDTH ADJUSTING DEVICE AND MICROSCOPE LASER PROCESSING APPARATUS

BACKGROUND OF THE INVENTION

1. Field of the Invention

The present invention relates to a slit width adjusting device and a microscope laser processing apparatus.

2. Description of Related Art

Conventionally, a slit width adjusting device is provided in a laser processing apparatus, and the like, to perform a correction such as a photomask, a flat panel display (FPD), and the like, by laser processing. The slit width adjusting device comprises a variable slit in a light path of a laser light, which is driven by a motor, and the width of the variable slit in the XY direction is adjusted so that the range for which one would like to perform a laser cut matches the slit shape. Thereby, when the laser light is emitted, the laser cut can be performed only for the range which matches the slit shape.

As such a slit width adjusting device, a technique is known in which slit members are in contact, and an original point signal generation electrode which generates an original point signal when the slit width is zero, is attached to the variable slit which is driven by a stepping motor. Thereby, the variable slit is adjusted to a predetermined width based on the original point (see for example, Japanese Patent Application Laid-open Publication No. 2001-208987).

However, in the slit width adjusting device according to the above mentioned Japanese Patent Application Laid-open Publication No. 2001-208987, there has been a problem in that the mechanism thereof is complicated because of the reasons such as a structure in which the slit members are isolated from a linear guide is required, the slit members are required to be provided with the original point signal generation electrode, and the like. Further, the original point signal generation electrodes are in contact with each other repeatedly each time the slit width is adjusted, thus the accuracy of the contacting position is decreased. In addition, a mechanical stability of the device is decreased due to the decreased rigidity and the like of the slit mechanism by the above mentioned contact. Thereby, there is a possibility that a detection accuracy of an original point position (which is the contacting position of the slit members) may be decreased as the detection is repeatedly performed. Moreover, the slit width adjusting device disclosed in Japanese Patent Application Laid-open Publication No. 2001-208987 further has a problem in that the slit width adjustment with a high accuracy has been difficult because the device does not comprise a means to correct the error, and the like, of the stepping motor caused by the mechanism of the slit width adjusting device.

SUMMARY OF THE INVENTION

The objects of the present invention include providing a slit width adjusting device and a microscope laser processing apparatus in which the slit width can be accurately recovered without using a complicated mechanism.

According to an aspect of the present invention, there is provided a slit width adjusting device comprising:

a pair of slit members which is parallel to each other, and which is moved so as to approach each other or to be separated from each other in order to adjust a slit width of the pair of slit members;

a driving section to move the pair of slit members in a direction so as to approach each other or in a direction so as to be separated from each other;

an absolute position original point detection section to detect an arbitrary absolute position of at least one of the pair of slit members as an original point; and an adjustment section to adjust the slit width by controlling a driving of the driving section, wherein the adjustment section comprises:

a storage unit to store a slit width table in which a displacement amount of the slit width from the original point, and a drive instruction value of the driving section corresponding to the displacement amount of the slit width from the original point, are corresponding to each other; and a drive control unit to instruct the storage unit to extract the drive instruction value of the driving section corresponding to a specified slit width, so as to drive the driving section according to the extracted drive instruction value.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein.

DETAILED DESCRIPTION OF THE PREFERRED EMBODIMENT

In the following, an aspect of the slit width adjusting device and the microscope laser processing apparatus according to the present invention is described in detail with reference to the drawings. However, the scope of the invention is not limited to the illustrated examples.

Figure 1:
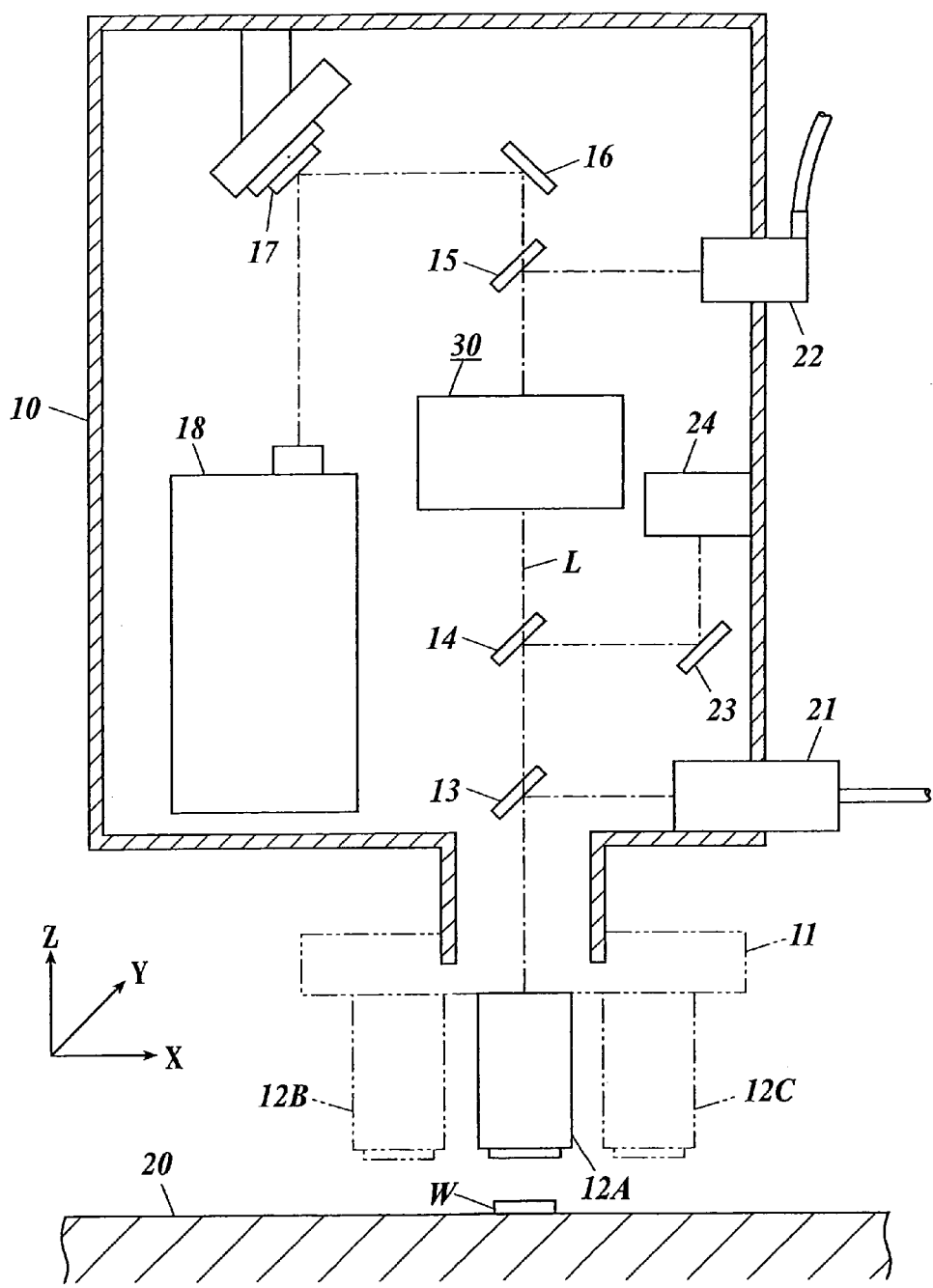
FIG. 1 is a cross-sectional view showing a microscope laser repair apparatus according to an embodiment of the present invention.
Figure 2:
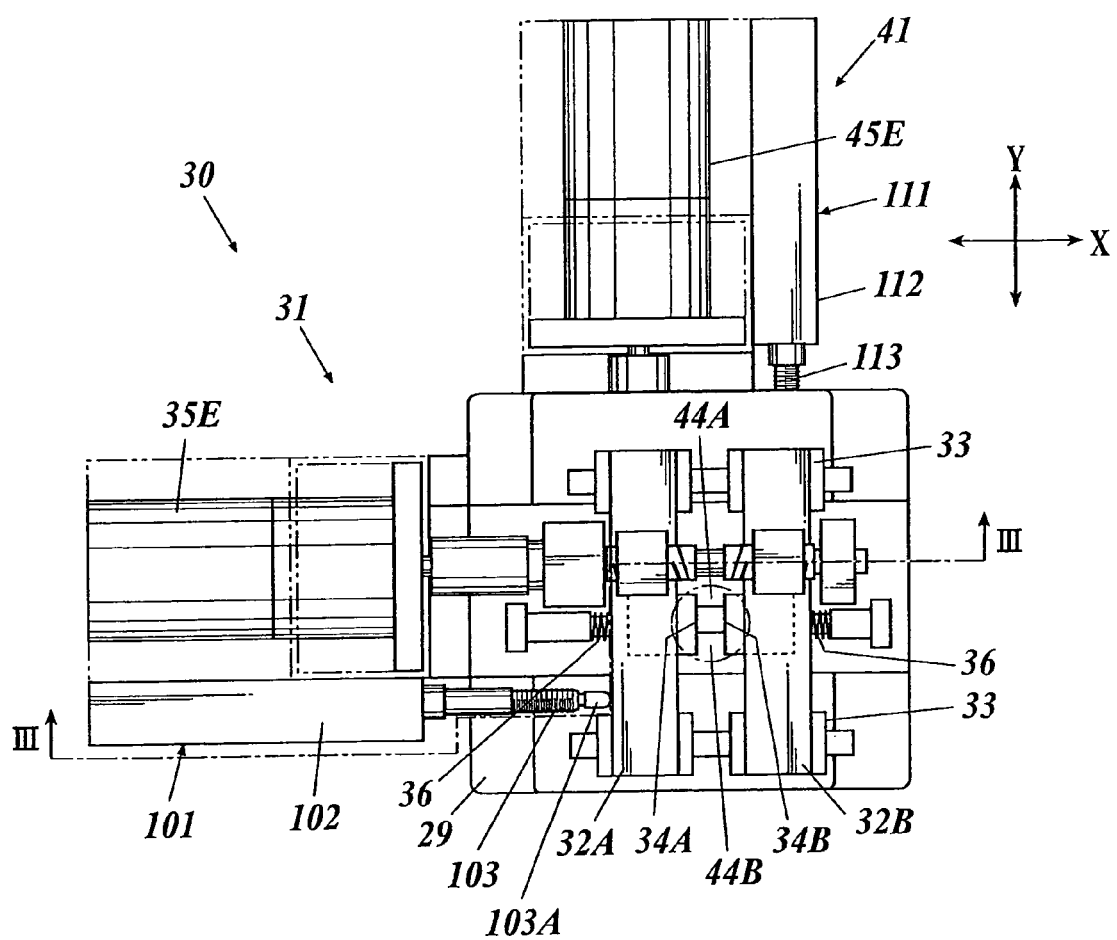
FIG. 2 is a plane view showing a slit width adjusting device according to the above mentioned embodiment.
Figure 3:
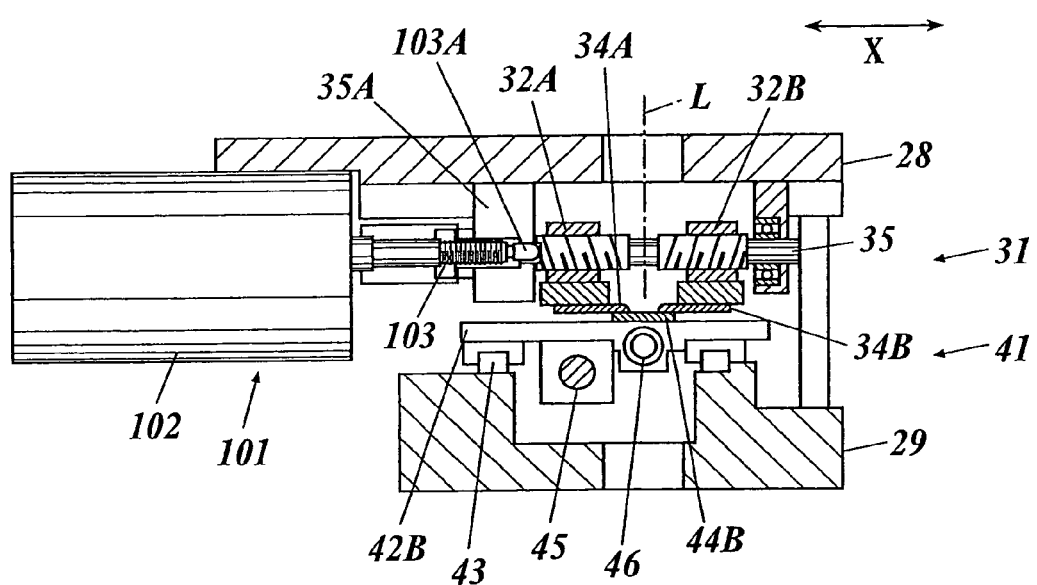
FIG. 3 is a cross-sectional view of III-III line of FIG. 2.
Figure 4:
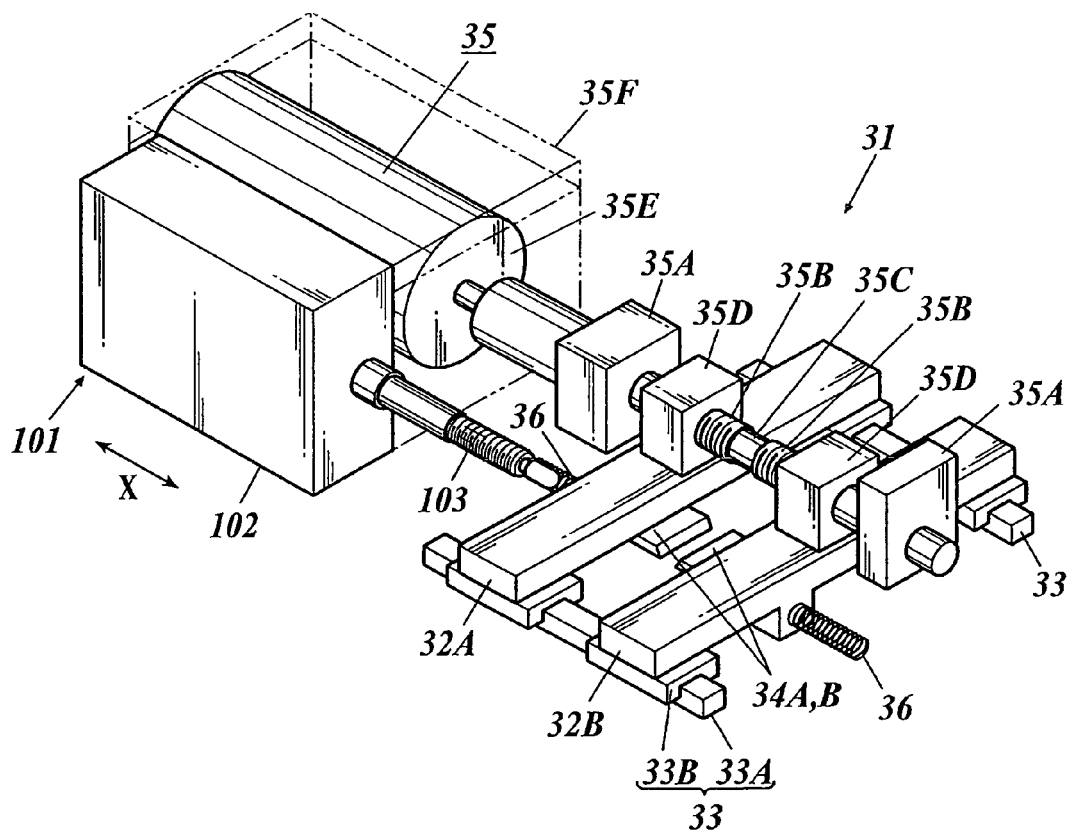
FIG. 4 is a perspective view showing a first group width adjusting mechanism and an ABS original point sensor according to the above mentioned embodiment.
Figure 5:
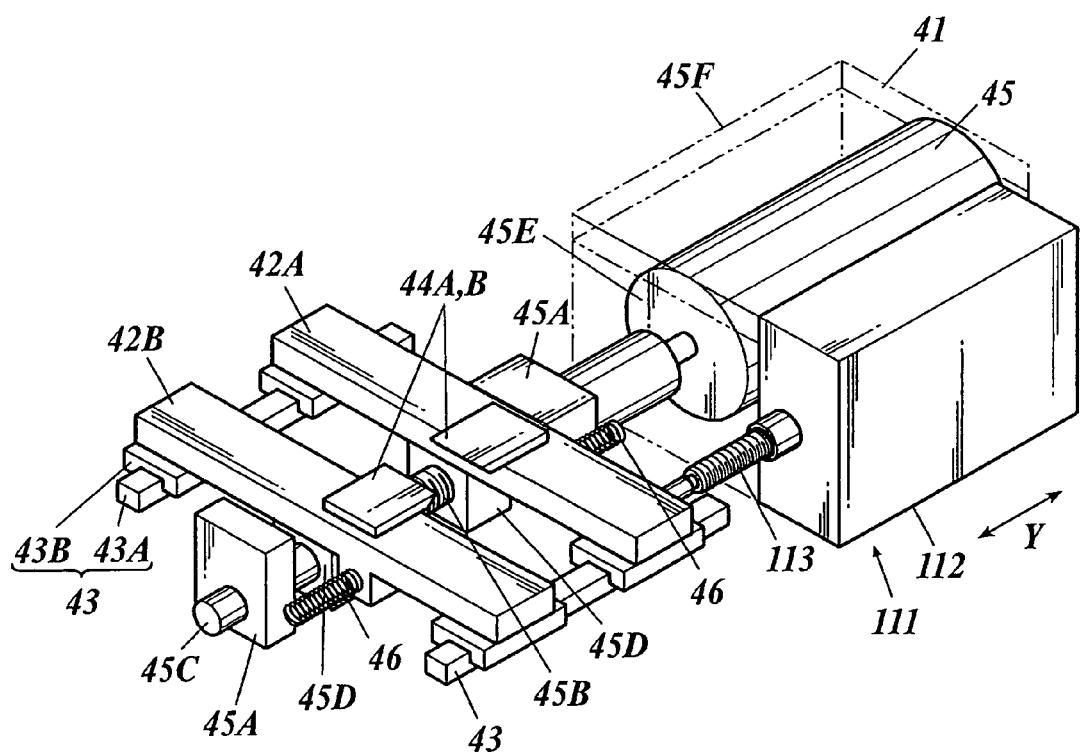
FIG. 5 is a perspective view showing a second group width adjusting mechanism and an ABS original point sensor according to the above mentioned embodiment.
Figure 6:
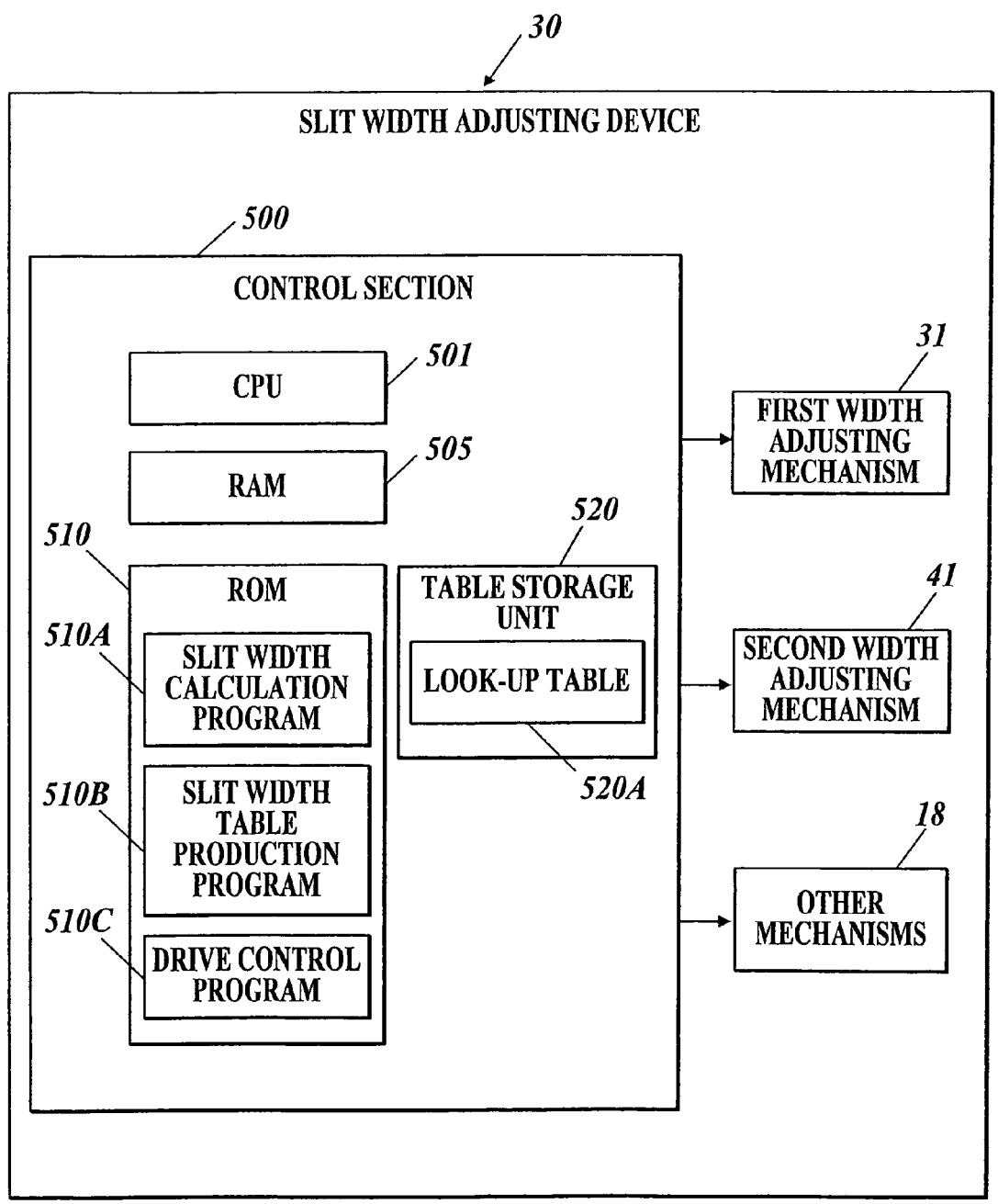
FIG. 6 is a block diagram of the above mentioned embodiment.
Figure 7:
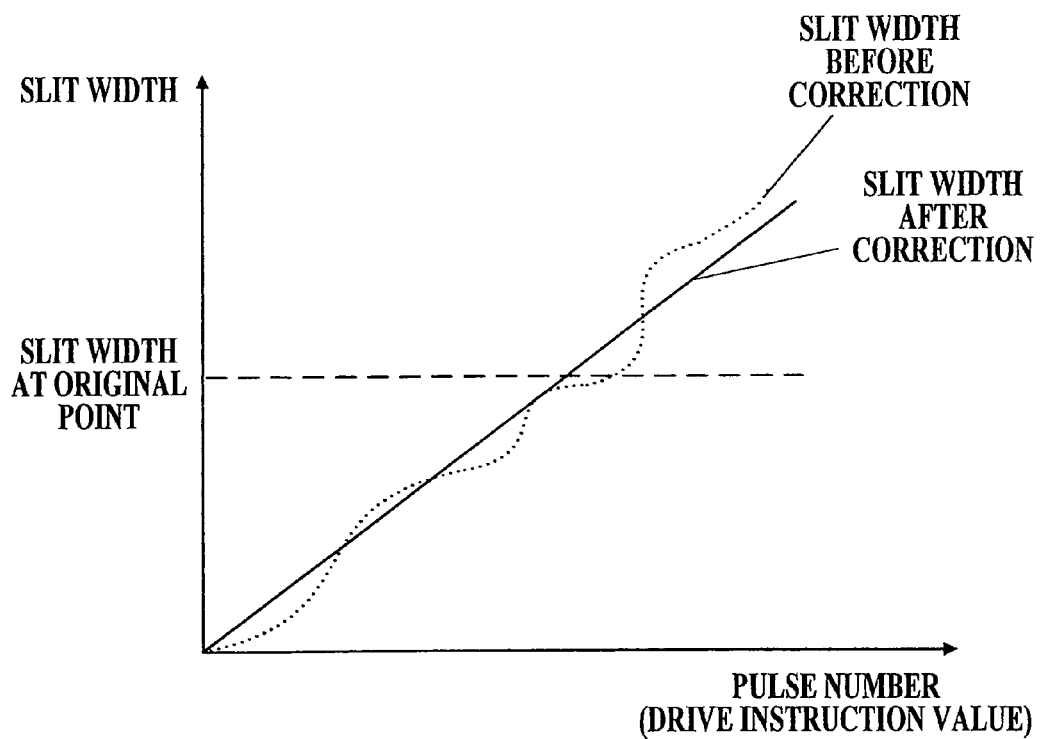
FIG. 7 is a view showing a relationship between a drive instruction value and a slit width according to the above mentioned embodiment.

FIG. 1 is a cross-sectional view showing a microscope laser repair apparatus 1 (the microscope laser processing apparatus) to which a slit width adjusting device 30 according to the present invention is applied; FIG. 2 is a plane view showing the slit width adjusting device 30; FIG. 3 is a cross-sectional view of III-III line of FIG. 2; FIG. 4 is a perspective view showing a first group width adjusting mechanism 31 and an ABS original point sensor 101; FIG. 5 is a perspective view showing a second group width adjusting mechanism 41 and an ABS original point sensor 111; FIG. 6 is a block diagram of the slit width adjusting device 30; and FIG. 7 is a view showing a relationship between a drive instruction value and a slit width according to the above mentioned embodiment. Here, a horizontal direction, a front-back direction, and a vertical direction of the microscope laser repair apparatus 1 in FIG. 1 are referred to as X direction, Y direction, and Z direction, respectively.

The microscope laser repair apparatus 1 comprises a stage 20 to place a sample W thereupon; a housing body 10 which is provided so as to be capable of moving relatively in three-dimensional directions (X, Y, and Z directions) with respect to the stage 20; and an objective lens replacing device 11 which is provided at a lower edge part of the housing body 10 and is configured so that objective lenses 12A (12B, 12C) each having a different magnifying power can be selectively attached thereto.

As shown in FIG. 1, an interior of the housing body 10 comprises a laser light emitting device 18 which is disposed at a left side in the X direction and at a lower side in the Z direction; a mirror 17 which is disposed at an upper side in the Z direction of the laser light emitting device 18; a mirror 16 which is disposed at a right side in the X direction of the mirror 17; the slit width adjusting device 30 which is disposed at a lower side in the Z direction of the mirror 16; a beam splitter 15 which is disposed between the mirror 16 and the slit width adjusting device 30; a slit illumination 22 which is disposed at a right side in the X direction of the beam splitter 15; a beam splitter 13 which is disposed at a lower side in the Z direction of the slit width adjusting device 30; an observation illumination 21 which is disposed at a right side in the X direction of the beam splitter 13; a beam splitter 14 which is disposed between the slit width adjusting device 30 and the beam splitter 13; a mirror 23 which is disposed at a right side in the X direction of the beam splitter 14; and an observation camera 24 which is disposed at an upper side in the Z direction of the mirror 23.

The laser light emitting device 18 is, for example, a light source to emit a laser light for laser processing, such as an yttrium aluminum garnet (YAG) laser, and the like, and emits the laser light toward the mirror 17 in a state where the laser light is expanded as a parallel pencil by a beam expander (not shown) which is provided at an edge part in the Z direction.

The mirrors 17 and 16 reflect the laser light emitted from the laser light emitting device 18 to a predetermined direction so that the emitted laser light irradiates the sample W through a light path L.

To put it concretely, the mirror 17 reflects the laser light in the upward Z direction which is emitted from the laser light emitting device 18 to the leftward X direction. Further, the mirror 16 reflects the laser light which is reflected by the mirror 17 to the downward Z direction.

The slit width adjusting device 30 is a device to let the laser light reflected by the mirror 16 pass only through a slit opening portion which is adjusted to a predetermined width. By letting the laser light pass through the slit width adjusting device 30, the sample W can be performed with a laser cut according to the size of the slit opening portion. The structure of the slit width adjusting device 30 will be described in detail later.

The beam splitter 15 is disposed on the light path (a light axis) L, and reflects an illumination light irradiated from the slit illumination 22 to the downward Z direction. Further, the beam splitter 15 transmits the laser light reflected by the mirror 16 so as to let the reflected laser light pass through the slit opening portion of the slit width adjusting device 30.

The beam splitter 13 is disposed on the light path (the light axis) L, and reflects an illumination light irradiated from the observation illumination 21 to the downward Z direction. Further, the beam splitter 13 transmits the laser light which has passed through the slit opening portion of the slit width adjusting device 30 so that the transmitted laser light enters the objective lens 12A.

The beam splitter 14 is disposed on the light path (the light axis) L, and reflects the reflected light of the illumination lights from the slit illumination 22 and the observation illumination 21 irradiating the sample W, to the right side in the X direction. Further, the beam splitter 14 transmits the laser light which has passed through the slit opening portion of the slit width adjusting device 30 so that the transmitted laser light enters the beam splitter 13.

The mirror 23 reflects the reflected light of the illumination light reflected by the beam splitter 14 toward the observation camera 24 which is disposed at the upper side in the Z direction.

The observation camera 24 is disposed so that the reflected light of the illumination light from the above mentioned slit illumination 22 and the observation illumination 21 irradiating the sample W, reaches the observation camera 24 through the beam splitter 14 and the mirror 23.

That is to say, a user can adjust the slit opening portion of the slit width adjusting device 30 to a preferable range of the laser cut, emit the laser light from the laser light emitting device 18, thereby perform the laser cut only for the range of the adjusted slit opening portion, while observing the sample W and the laser cut target portion thereof through the observation camera 24.

Further, the observation camera 24 can pick up an image of the slit opening portion of the slit width adjusting device 30 (hereinbelow referred to as a slit image), thus functions as a pickup section.

Next, the slit width adjusting device 30 is described with reference to FIGS. 2 and 3.

The slit width adjusting device 30 comprises two supporting plates 28, 29 which are disposed apart in a state of being parallel to each other; a first width adjusting mechanism 31 which is provided in the lower surface of the supporting plate 28 placed on the upper side, and which can move a pair of first slit members 34A, 34B in a direction perpendicular to the light axis L of the objective lens 12A, both in a direction approaching each other and in a direction separating from each other (X direction); a second width adjusting mechanism 41 to move a pair of second slit members 44A, 44B in a direction perpendicular to the light axis L and perpendicular to the moving direction of the first slit members 34, both in a direction approaching each other and in a direction separating from each other (Y direction); and a first ABS original point sensor 101, a second ABS original point sensor 111 as absolute position detection sections (photoelectric type absolute position detection sensors) to detect absolute positions of an original point of a movable member 32A provided in the first width adjusting mechanism 31, and of an original point of a movable member 42A provided in the second width adjusting mechanism 41, respectively.

As shown in FIG. 4, the first width adjusting mechanism 31 comprises a pair of movable members 32A, 32B disposed in a state of being parallel to each other; a pair of straight line guiding section 33 which is disposed perpendicular to the pair of movable members 32A, 32B on both edge sides, so as to guide the movable members 32A, 32B in the X direction in a state of being movable; slit members 34A, 34B which are provided facing each other at a substantially middle position between the pair of movable members 32A, 32B; a driving section 35 to move the pair of movable members 32A, 32B both in a direction approaching each other and in a direction separating from each other at the substantially middle position between the pair of movable members 32A, 32B; and coil springs 36 to respectively bias the pair of movable members 32A, 32B individually, in a direction approaching each other (or in a direction separating from each other).

The straight line guiding section 33 comprises a pair of guide rails 33A which is respectively disposed along the moving direction (X direction) of the movable members 32A, 32B; and a slider 33B which is provided on each of the guide rails 33A in a state of being movable through a rolling element such as a line of balls which revolves cyclically, so as to support the edge portion of the movable members 32A, 32B.

The slit members 34A, 34B are formed as a rectangular plate shape in a planar view so that the facing edge portions are in a state of a taper blade having a V-shape. The slit members 34A, 34B move in a direction approaching each other or in a direction separating from each other according to the movement of the movable members 32A, 32B, thus the slit width in the X axis direction can be adjusted.

The driving section 35 comprises a feed screw axis 35C having a screw section 35B which is disposed substantially perpendicular to the pair of the movable members 32A, 32B through a ball bearing block 35A which is attached to the lower surface of the supporting plate 28 placed on the upper side, which is to revolve in an opposite direction in the axis direction (a right screw and a left screw), and which is accurate (for example, a lead thereof is approximately 0.25 mm, respectively); nut members 35D which respectively are to be screwed together with the screw section 35B of the feed screw axis 35C and which respectively are fixed to each of the movable members 32A, 32B; a stepping motor 35E to rotate the feed screw axis 35C and which is drive controlled by a control section 500 which will be described later; and a motor cover 35F of the stepping motor 35E.

The stepping motor 35E has a configuration so as to rotate by a predetermined angle according to a pulse number to be applied (a drive instruction value). Thus, by switching the rotation direction thereof to and from a left rotation/a right rotation, the movable members 32A, 32B (and the slit members 34A, 34B) can be moved in a direction approaching each other or separating from each other.

Accordingly, when a driving force is added by the driving section 35, in the X axis direction, the movable members 32A, 32B can move in the state of approaching each other or separating from each other, substantially symmetrically with respect to a center axis (the Z axis).

The coil springs 36 are provided to each of the movable members 32A, 32B so as to respectively bias the movable members 32A, 32B individually, in a direction approaching each other or in a direction separating from each other.

As shown in FIG. 5, the second width adjusting mechanism 41 comprises a pair of movable members 42A, 42B disposed in a state of being parallel to each other; a pair of straight line guiding section 43 which are disposed perpendicular to the pair of movable members 42A, 42B on both edge sides, so as to guide the movable members 42A, 42B in the Y direction in a state of being movable; slit members 44A, 44B which are provided facing each other at a substantially middle position between the pair of movable members 42A, 42B; a driving section 45 to move the pair of movable members 42A, 42B both in a direction approaching each other and in a direction separating from each other at the substantially middle position between the pair of movable members 42A, 42B; and coil springs 46 to respectively bias the pair of movable members 42A, 42B individually, in a direction approaching each other (or in a direction separating from each other).

The straight line guiding section 43 comprises a pair of guide rails 43A which is respectively disposed along the moving direction (Y direction) of the movable members 42A, 42B; and a slider 43B which is provided on each of the guide rails 43A in a state of being movable through a rolling element such as a line of balls which revolves cyclically, so as to support the edge portion of the movable members 42A, 42B.

The slit members 44A, 44B are formed as a rectangular plate shape in a planar view so that the facing edge portions are in a state of a taper blade. The slit members 44A, 44B move in a direction approaching each other or in a direction separating from each other according to the movement of the movable members 42A, 42B, thus the slit width in the Y axis direction can be adjusted.

Accordingly, the space portion formed by the slit members 44A, 44B and by the slit members 34A, 34B is to be the slit opening portion, thus a transmittance range of the laser light emitted from the laser light emitting device 18 can be controlled.

The driving section 45 comprises a feed screw axis 45C having a screw section 45B which is disposed substantially perpendicular to the pair of the movable members 42 through a ball bearing block 45A which is attached to the upper surface of the supporting plate 29 placed on the lower side, which is to revolve in an opposite direction in the axis direction (a right screw and a left screw), and which is accurate (for example, a lead thereof is approximately 0.25 mm, respectively); nut members 45D which respectively are to be screwed together with the screw section 45B of the feed screw axis 45C and which respectively are fixed to each of the movable members 42A, 42B; a stepping motor 45E to rotate the feed screw axis 45C and which is drive controlled by the control section 500 which will be described later; and a motor cover 45F of the stepping motor 45E.

The stepping motor 45E has a configuration so as to rotate by a predetermined angle according to a pulse number to be applied (a drive instruction value). Thus, by switching the rotation direction thereof to and from a left rotation/a right rotation, the movable members 42A, 42B (and the slit members 44A, 44B) can be moved in a direction approaching each other or separating from each other.

Accordingly, when a driving force is added by the driving section 45, in the Y axis direction, the movable members 42A, 42B can move in the state of approaching each other or separating from each other, substantially symmetrically with respect to the light axis (the Z axis).

The coil springs 46 are provided to each of the movable members 42A, 42B so as to respectively bias the movable members 42A, 42B individually, in a direction approaching each other or in a direction separating from each other.

Accordingly, by moving the pair of slit members 34A, 34B in the direction approaching each other or separating from each other by the first width adjusting mechanism 31, and by moving the pair of slit members 44A, 44B in the direction approaching each other or separating from each other by the second width adjusting mechanism 41, the slit opening portion formed by the slit members 34A, 34B and the slit members 44A, 44B can be formed into a desirable shape.

In addition, because the pair of movable members 32A, 32B, and the movable members 42A, 42B which are parallel to each other, respectively, are guided by the pair of the straight line guiding sections 33, 43 at both edge sides so as to be movable, respectively, the tilt of the movable members 32A, 32B, and of the movable members 42A, 42B can be reduced, compared to the configuration in which the movable members are guided by the straight line guiding sections at only one edge side so as to be movable, respectively. Further, because the driving sections 35, 45 are provided to move the movable members 32A, 32B and the movable members 42A, 42B in a direction approaching each other or in a direction separating from each other, respectively, at the substantially middle position between the pair of movable members 32A, 32B, and the movable members 42A, 42B, respectively, the tilt of the movable members 32A, 32B, and of the movable members 42A, 42B can be further reduced. Moreover, in such a configuration, because the slit members 34A, 34B, and the slit members 44A, 44B are provided so as to face each other at the substantially middle position between the pair of movable members 32A, 32B, and the movable members 42A, 42B, respectively, the slit opening portion formed by the slit members 34A, 34B, and the slit members 44A, 44B can be made to be variable with high accuracy, and the high accuracy can be maintained even when used repeatedly.

Further, by reducing the lead of the feed screw axes 35C, 45C which are provided in the first width adjusting mechanism 31 and the second width adjusting mechanism 41, respectively, the feeding accuracy can be improved. Especially, when a feed screw axis (having for example, a pitch of 0.25 mm) applied to a micrometer head is used, the feed screw axis has a high screwing accuracy and an extremely small backlash, thus a high feeding accuracy can be assured.

Moreover, in a case where the above described feed screw axes 35C, 45C are applied to the driving sections 35, 45, a problem has been generated in that the accuracy decreases as it is used repeatedly due to the backlash generated between the nut members 35D, 45D which are screwed together with the feed screw axes 35C, 45C. In the present embodiment, however, the coil springs 36, 46 are provided to respectively bias the pair of movable members 32A, 32B, and the movable members 42A, 42B in a direction approaching each other or separating from each other, thus there would be no problem caused by the backlash, and a high recovery can be maintained. In addition, because the coil springs 36, 46 are individually provided to each of the movable members 32A, 32B, 42A, 42B, the most suitable bias force can be added according to the difference of the weight and the sliding friction of the movable members. Thus, a preferable moving operation of each of the movable members 32A, 32B, 42A, 42B can be assured.

As shown in FIG. 4, the ABS original point sensor 101 is fixed by the motor cover 35F of the stepping motor 35E, and comprises a main body part 102; a spindle operation part 103 to operate in the axis direction (the X axis direction) of the feed screw axis 35C; and a contact 103A which is positioned at an edge of the spindle operation part 103 and is attached to a left edge portion in the X direction of the movable member 32A. The spindle operation part 103 is configured so that when the movable member 32A is driven by the driving section 35, the spindle operation part 103 moves integrally with the movable member 32A.

As shown in FIG. 5, the ABS original point sensor 111 is fixed by the motor cover 45F of the stepping motor 45E, and comprises a main body part 112; a spindle operation part 113 to operate in the axis direction (the Y axis direction) of the feed screw axis 45C; and a contact 113A which is positioned at an edge of the spindle operation part 113 and is attached to a left edge portion in the Y direction of the movable member 42A. The spindle operation part 113 is configured so that when the movable member 42A is driven by the driving section 45, the spindle operation part 113 moves integrally with the movable member 42A.

The interior of each of the ABS original point sensors 101 and 111 comprises a fixed scale unit which is fixed respectively to the main body parts 102 and 112; and a moving unit which is respectively connected to the spindle operation parts 103 and 113 so as to move together with the operation of the spindle operation parts 103 and 113.

Further, the fixed scale unit comprises an original point mark of a light transmissive type at a predetermined position respectively in the moving direction (X direction) of the spindle operation part 103 and in the moving direction (Y direction) of the spindle operation part 113; a light source to irradiate the original point mark and an optical grid of a light transmissive type for the original point mark detection in the moving unit (which will be described later); and a light reception sensor to receive the light irradiated from the light source and which was transmitted by the original point mark and the optical grid. On the other hand, the moving unit comprises an optical grid of a light transmissive type for the original point mark detection in the moving direction (X direction) of the spindle operation part 103 and in the moving direction (Y direction) of the spindle operation part 113, respectively.

Thus, by the original point detection function of the ABS original point sensors 101 and 111, when the movable members 32A, 42A (and the slit members 34A, 44A) are moved by the driving sections 35, 45, and the spindle operation parts 103, 113 move integrally with the movable members 32A, 43A, the optical grid for the original point mark detection in the moving unit passes through the original point mark in the fixed scale unit at a predetermined position in the X, Y direction, respectively. The light irradiated from the light source of the fixed scale unit at the occasion, is transmitted by the optical grid for the original point mark detection and the original point mark, and the transmitted light is received by the light reception sensor of the fixed scale unit. Thereby, even when the power source of the slit width adjusting device 30 and/or the microscope laser repair apparatus 1 is interrupted, the original point of the absolute position thereof can always be detected.

Incidentally, the above described absolute position detection section is not limited to that by an optical detection, and the original point detection may also be performed, for example by, an absolute encoder of an electrostatic capacitance type, based on an electrostatic capacitance variation measured by a scale for the original point detection.

Further, the position to detect the above original point may of course be set to a position where the slit members 34A and 34B contact with each other, or a position where the slit members 44A and 44B contact with each other.

Next, as shown in FIG. 6, the control section 500 comprises a central processing unit (CPU) 501; a random access memory (RAM) 505; a read only memory (ROM) 510; a table storage unit 520, and the like. The first and the second width adjusting mechanisms 31, 41, and other mechanisms (for example, the laser light emitting device 18, and the like) are connected to the control section 500.

The CPU 501 performs an execution of various processing programs stored in the ROM 510, and storage of the processing data in the RAM 505.

The RAM 505 comprises a program storage region to extract the processing programs executed by the CPU 501, and the like; and a data storage region to store input data and data pertaining to processing results generated when the above processing programs are executed, and the like.

The ROM 510 stores various processing programs to be executed by the CPU 501, which for example are a slit width calculation program 510A, a slit width table production program 510B, a drive control program 510C, and the like.

The table storage unit 520 functions as a storage section (an adjustment section) to store a look-up table 520A (a slit width table) to adjust the slit width and the pulse number applied to the stepping motors 35E, 45E.

The slit width calculation program 510A is a calculation section to calculate the slit width from a slit image which is to be picked up by the observation camera 24 as the pickup section.

That is to say, the CPU 501 executes the slit width calculation program 510A so that the position of the edge portion of the slit members 34A, 34B and the position of the edge portion of the slit members 44A, 44B are recognized from the slit image which has been picked up by the observation camera 24. Then, a distance between each of the edge portions is measured, respectively, thereby the slit width in the X direction formed by the slit members 34A, 34B and the slit width in the Y direction formed by the slit members 44A, 44B can be calculated under the consideration of the magnifying power of the objective lens, and the like.

The slit width table production program 510B is a production section to produce a look-up table 520A based on the slit width calculated by the slit width calculation program 510A and on the pulse number applied to the pulse motor in order to form the slit width, so as to store the produced look-up table 520A in the table storage unit 520.

Here, when a predetermined pulse number is applied to the stepping motors 35E, 45E, the slit members 34A, 34B (the movable members 32A, 32B), and the slit members 44A, 44B (movable members 42A, 42B) move in a direction approaching each other or separating from each other. Thereby the slit width (the slit width before correction) formed by each of the slit members changes with nonlinearity as shown by the broken line in FIG. 7, according to the pulse number to be applied, due to the error caused by mechanisms of the first and the second width adjusting mechanisms 31, 41 (the pitch error of the feed screw axis 35C, 45C, and the error caused by the whole length of the screw axis), and the like. Thus, as shown by the solid line in FIG. 7, in order to give linearity to the drive instruction value to drive the stepping motors 35E, 45E and to the slit width, it is necessary to calculate in advance the pulse number for correction to increase or decrease the pulse number to be applied for each drive instruction value.

The original point of the absolute position of the slit members 34A and 44A can be accurately detected by the ABS original point sensors 101 and 111. Thereby, each slit width when the slit members 34A and 44A are at the original point (for example, the slit width at the original point shown in FIG. 7), and the pulse number applied to the stepping motors 35E, 45E when the slit members 34A and 44A are moved to the position where the slit members 34A and 44A are in contact with the slit members 34B and 44B, respectively, by the stepping motors 35E, 45E, are set to be a reference value. Thus, the pulse number for correction to obtain linearity is calculated, thereby the linearity of the drive instruction value and the slit width can further be increased.

That is to say, when the CPU 501 executes the slit width table production program 510B, the look-up table 520A is produced in which an amount of displacement of the slit width from the slit width at the original point, and the pulse number corresponding to the amount of displacement, are corresponding with each other, in order to give linearity to the drive instruction value and to the slit width, so that the produced look-up table 520A is stored in the table storage unit 520.

The drive control program 510C is a drive control section and an adjustment section to drive and to adjust the driving section 35, 45, based on the look-up table 520A stored in the table storage unit 520.

That is to say, when the CPU 501 executes the drive control program 510C, the pulse number corresponding to the drive instruction value which is to be necessary in order to form the slit width specified by a user, is extracted among the look-up table 520A which is produced by the slit width table production program 510B and is stored in the table storage unit 520. The extracted pulse number is applied to the stepping motor 35E or 45E, thereby the slit width specified by the user can accurately be recovered.

[Setting of the Slit Width at Original Point and Production of the Look-Up Table]

Next, the setting of the slit width which is to be the basis of the slit members 34A, 34B (that is to say, the original point slit width at the original point of the slit member 34A), and of the original point slit width of the slit members 44A, 44B (that is to say, the original point slit width at the original point of the slit member 44A), and the production of the look-up table 520A, in the above mentioned slit width adjusting device 30 and in the microscope laser repair apparatus 1, are described.

First, the original point slit width of the slit members 34A, 34B and the original point slit width of the slit members 44A, 44B are set in advance to a width which is the half of the maximum value of each slit width, for example. The ABS original point sensors 101 and 111 are fixed to the motor covers 35F, 45F so that the original point of the absolute position of the slit members 34A, 44A is detected at the position of the movable members 32A, 42A at the set original point slit width, respectively.

Next, a mirror is placed on the stage 20 instead of the sample W, and the slit width (the opening portion formed by the slit members 34A, 34B or by the slit members 44A, 44B) of the slit members 34A, 34B (or the slit members 44A, 44B) is picked up by the observation camera 24. Then, the movable members 32A, 32B (or the movable members 42A, 42B) are moved to a position where the slit width from the original point slit width is to be zero (the position where the facing slit members 34A, 34B (or the slit members 44A, 44B) are in contact with each other). The pulse number which is applied to the stepping motors 35E, 45E at the occasion of the movement is stored in the storage unit (which is not shown) in the control section 500, thereby the position at which the slit width is to be zero can be obtained.

Subsequently, when the CPU 501 executes the slit width calculation program 510A and the slit width table production program 510B, for example, the slit width (the slit width before correction) is calculated each time the pulse number corresponding to the slit width displacement amount of 0.01 mm (the amount of displacement corresponding to the lead (approximately 0.25 mm) of the feed screw axes 35C, 45C), from the position at which the slit width is to be zero, is applied to the stepping motors 35E, 45E. Then, the pulse number for correction to give the linearity to the slit width is calculated, and the calculated pulse number for correction is stored in the look-up table 520A.

Here, the above described setting and production is performed in advance in the manufacturing process of the microscope laser repair apparatus 1. At the time of the usage of the microscope laser repair apparatus 1 by a user, when a predetermined slit width is specified, the CPU 501 executes the drive control program 510C, so that the slit members 34A, 34B (or the slit members 44A, 44B) are moved to the position where the slit width is to be zero which is obtained by the above described settings. The stepping motors 35E, 45E are driven based on the pulse number for correction which is stored in the look-up table 520A, thereby the slit width can be set accurately.

Incidentally, the microscope laser repair apparatus 1 may alternatively be configured so that when the CPU 501 executes the drive control program 510C, the stepping motors 35E, 45E are driven based on the pulse number for correction stored in the look-up table 520A, without moving the slit members to the position where the slit width are to be zero, thereby the slit width is directly set as the user desires.

As described above, in the slit width adjusting device 30 and the microscope laser repair apparatus 1 according to the embodiment of the present invention, an arbitrary absolute position of one of the slit members is set as an original point, by the ABS original point sensor 101 (or 111), in a state where a pair of slit members 34A, 34B (or 44A, 44B) are placed in a predetermined position. A look-up table 520A in which the amount of displacement of the slit width from the original point, and a drive instruction value (the pulse number which is applied to the stepping motor 35E or 45E) of the driving section 35 (or 45) corresponding to the amount of displacement of the slit width from the original point, are corresponding to each other, is stored in the table storage unit 520. The driving section 35 (or 45) is driven according to the drive instruction value written in the look-up table 520A, thereby the slit width can be recovered accurately without using a complicated mechanism.

Further, even when a repair operation of the sample is prolonged and a case in which the power source has to be interrupted is occurred, by comprising the ABS original point sensors 101, 111 as the absolute position original point detection section according to the embodiment of the present invention, the position of the original point can be accurately detected so as to recover the slit width before the interruption of the power source at the time of the restarting. Thus, the repair operation can be performed with the substantially same slit width before the interruption of the power source, thereby the effort and work needed for the recovery of the slit width can be reduced.

Further, in the microscope laser repair apparatus 1 in which the laser light is emitted to correct the sample, the slit width adjusting device 30 is provided in the light path of the laser light, and the slit opening portion can be varied with a high accuracy, thereby the correction of the sample can be performed accurately. Accordingly, the correction for a microscopic device circuit such as a semiconductor or a liquid crystal panel can be performed with high accuracy and with efficiency.

Incidentally, the ABS original point sensor is used as the absolute position original point detection section in the embodiment of the present invention, however, it is not limited to the ABS original point sensor, as long as it can detect the original point of the absolute position, and can detect the position even after the interruption of the power source, at the time of the forming of the predetermined slit width of the slit members.

Further, the slit width adjusting device is applied not only for a laser cut but may also be used for the correction of white defects caused by a laser chemical vapor deposition (CVD) method.

Further, the slit width adjusting device is not limited to being comprised in the microscope laser processing apparatus, and for example, the device may also be used in a case in which the opening of an aperture such as a field stop or an aperture stop, and the like, used in a predetermined optical system is set/adjusted by using the original point detection section of the absolute position; the stepping motor, and the like.

According to an aspect of the preferred embodiments of the present invention, there is provided a slit width adjusting device comprising:

a pair of slit members which is parallel to each other, and which is moved so as to approach each other or to be separated from each other in order to adjust a slit width of the pair of slit members;

a driving section to move the pair of slit members in a direction so as to approach each other or in a direction so as to be separated from each other;

an absolute position original point detection section to detect an arbitrary absolute position of at least one of the pair of slit members as an original point; and an adjustment section to adjust the slit width by controlling a driving of the driving section, wherein the adjustment section comprises:

a storage unit to store a slit width table in which a displacement amount of the slit width from the original point, and a drive instruction value of the driving section corresponding to the displacement amount of the slit width from the original point, are corresponding to each other; and a drive control unit to instruct the storage unit to extract the drive instruction value of the driving section corresponding to a specified slit width, so as to drive the driving section according to the extracted drive instruction value.

Preferably, the absolute position original point detection section is a photoelectric type absolute position detection sensor.

Preferably, the driving section comprises a stepping motor to rotate according to a predetermined pulse number applied to the stepping motor, and wherein the drive instruction value is the pulse number applied to the stepping motor.

Preferably, the slit width adjusting device further comprises:

a pickup section to pick up a slit image of a slit formed by the pair of slit members;

a calculation section to calculate the slit width from the slit image picked up by the pickup section;

a production section to produce the slit width table based on (i) the slit width calculated by the calculation section and (ii) the drive instruction value of the driving section corresponding to the calculated slit width, so as to instruct the storage unit to store the produced slit width table.

Preferably, provided is a microscope laser processing apparatus to emit a laser light so as to correct an examination object, comprising the slit width adjusting device, wherein the pair of slit members is disposed in a light path of the emitted laser light.

According to the embodiment of the present invention, an arbitrary absolute position of one of a pair of slit members, in the pair of slit members is detected as an original point, by the absolute position original point detection section. A slit width storage table in which the amount of displacement of the slit width from the original point, and a drive instruction value of the driving section, corresponding to the amount of displacement of the slit width from the original point, are corresponding to each other, is stored. The driving section is driven according to the drive instruction value written in the slit width storage table, thereby the slit width can be recovered accurately.

Accordingly, a slit width adjusting device and the microscope laser processing apparatus in which the slit width can be accurately be recovered can be obtained without using a complicated mechanism.

The entire disclosure of Japanese Patent Application No. 2008-160054 filed on Jun. 19, 2008 including description, claims, drawings, and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A slit width adjusting device comprising:
a pair of slit members which is parallel to each other, and which is moved so as to approach each other or to be separated from each other in order to adjust a slit width of the pair of slit members;
a driving section to move the pair of slit members in a direction so as to approach each other or in a direction so as to be separated from each other;
an absolute position original point detection section to detect an arbitrary absolute position of at least one of the pair of slit members as an original point, the absolute position original point detection section including:
a main body section disposed in a fixed position with respect to the driving section, the main body section including a fixed scale disposed in the main body section, and
a moving unit connected to one end of a spindle, a longitudinal axis of the spindle being oriented in a direction of movement of the slit members, the other end of the spindle moving integrally with movement of the at least one of the pair of slit members driven by the driving section, the arbitrary absolute position of the at least one of the pair of slit members being detected as the original point by comparing a position of the moving unit with respect to the fixed scale; and
an adjustment section to adjust the slit width by controlling a driving of the driving section, wherein
the adjustment section comprises:
a storage unit to store a slit width table in which a displacement amount of the slit width from the original point, and a drive instruction value of the driving section corresponding to the displacement amount of the slit width from the original point, are corresponding to each other; and
a drive control unit to instruct the storage unit to extract the drive instruction value of the driving section corresponding to a specified slit width, so as to drive the driving section according to the extracted drive instruction value.

2. The slit width adjusting device according to claim 1, wherein the absolute position original point detection section is a photoelectric absolute position detection sensor.

3. The slit width adjusting device according to claim 1, wherein the driving section comprises a stepping motor to rotate according to a predetermined pulse number applied to the stepping motor, and wherein the drive instruction value is the pulse number applied to the stepping motor.

4. The slit width adjusting device according to claim 1, further comprising:
a pickup section to pick up a slit image of a slit formed by the pair of slit members;
a calculation section to calculate the slit width from the slit image picked up by the pickup section;
a production section to produce the slit width table based on (i) the slit width calculated by the calculation section and (ii) the drive instruction value of the driving section corresponding to the calculated slit width, so as to instruct the storage unit to store the produced slit width table.

5. A microscope laser processing apparatus to emit a laser light so as to correct an examination object, comprising a slit width adjusting device including:
a pair of slit members which is parallel to each other, and which is moved so as to approach each other or to be separated from each other in order to adjust a slit width of the pair of slit members, the pair of slit members being disposed in a light path of the emitted laser light;
a driving section to move the pair of slit members in a direction so as to approach each other or in a direction so as to be separated from each other;
an absolute position original point detection section to detect an arbitrary absolute position of at least one of the pair of slit members as an original point, the absolute position original point detection section including:
a main body section disposed in a fixed position with respect to the driving section, the main body section including a fixed scale disposed in the main body section, and
a moving unit connected to one end of a spindle, a longitudinal axis of the spindle being oriented in a direction of movement of the slit members, the other end of the spindle moving integrally with movement of the at least one of the pair of slit members driven by the driving section, the arbitrary absolute position of the at least one of the pair of slit members being detected as the original point by comparing a position of the moving unit with respect to the fixed scale; and
an adjustment section to adjust the slit width by controlling a driving of the driving section, wherein
the adjustment section comprises:
a storage unit to store a slit width table in which a displacement amount of the slit width from the original point, and a drive instruction value of the driving section corresponding to the displacement amount of the slit width from the original point, are corresponding to each other; and
a drive control unit to instruct the storage unit to extract the drive instruction value of the driving section corresponding to a specified slit width, so as to drive the driving section according to the extracted drive instruction value.

* * * * *